US008907323B2

(12) United States Patent
Freedman

(10) Patent No.: US 8,907,323 B2
(45) Date of Patent: Dec. 9, 2014

(54) MICROPROCESSOR ASSEMBLY

(76) Inventor: Philip D. Freedman, Alexandria, VA (US)

( * ) Notice: Subject to any disclaimer, the term of this patent is extended or adjusted under 35 U.S.C. 154(b) by 588 days.

(21) Appl. No.: 11/381,583

(22) Filed: May 4, 2006

(65) Prior Publication Data

US 2006/0181854 A1 Aug. 17, 2006

Related U.S. Application Data

(63) Continuation-in-part of application No. 10/127,585, filed on Apr. 23, 2002, now Pat. No. 7,208,191.

(51) Int. Cl.
*H01L 39/12* (2006.01)
*H01L 23/373* (2006.01)
*B82Y 30/00* (2011.01)

(52) U.S. Cl.
CPC ............... *H01L 23/373* (2013.01); *B82Y 30/00* (2013.01); *H01L 2924/3011* (2013.01); *Y10S 977/734* (2013.01)
USPC .............. 257/40; 257/E39.008; 257/E51.039; 977/734

(58) Field of Classification Search
None
See application file for complete search history.

(56) References Cited

U.S. PATENT DOCUMENTS

| 3,031,516 | A |   | 3/1961  | Pessel |
|---|---|---|---|---|
| 3,999,283 | A |   | 12/1976 | Dean et al. |
| 5,547,774 | A | * | 8/1996  | Gimzewski et al. .......... 428/826 |
| 5,698,497 | A | * | 12/1997 | Haddon et al. ................ 505/220 |
| 5,998,089 | A |   | 12/1999 | Tajima |
| 6,055,814 | A |   | 5/2000  | Song |
| 6,277,318 | B1 | * | 8/2001  | Bower et al. .................. 264/346 |
| 6,288,899 | B1 |   | 9/2001  | Smith |
| 6,303,760 | B1 | * | 10/2001 | Dorn et al. ....................... 534/11 |
| 6,347,521 | B1 | * | 2/2002  | Kadotani et al. ................ 62/3.7 |
| 6,384,727 | B1 | * | 5/2002  | Diprizio et al. ............ 340/572.7 |
| 6,471,929 | B1 |   | 10/2002 | Kusunoki et al. |
| 6,479,111 | B2 |   | 11/2002 | Dykes |
| 6,492,585 | B1 | * | 12/2002 | Zamboni et al. .............. 136/201 |
| 6,689,674 | B2 |   | 2/2004  | Zhang |
| 6,712,864 | B2 |   | 3/2004  | Hariuchi |
| 6,743,481 | B2 |   | 6/2004  | Hoehn |

(Continued)

FOREIGN PATENT DOCUMENTS

| WO | 0026138 | 5/2000 |
|---|---|---|
| WO | WO 0130694 A1 * | 5/2001 |
| WO | WO 2004057674 A2 * | 7/2004 |

OTHER PUBLICATIONS

Winder et al., Thermoelectric Devices: Solid State Refrigerators and Electrical Generators in the classroom, Journal of Chemical Education, 1996 (73) 940 (Oct).

(Continued)

*Primary Examiner* — Wensing Kuo
(74) *Attorney, Agent, or Firm* — Philip D. Freedman; Philip D. Freedman PC

(57) ABSTRACT

A thermoelectric element comprises a substrate with a patterned discontinuous fullerene thin film. A method of applying a patterned discontinuous fullerene thin film to a substrate comprises applying a mask to the substrate, the mask defining a conductive electric network, applying a fullerene material to the masked substrate to deposit a patterned discontinuous fullerene thin film, applying a selected bond breaking force to the network to disassociate fullerene carbon to fullerene carbon bonds without disassociating fullerene carbon to substrate bonds to form a patterned discontinuous fullerene thin film substantially a single fullerene molecule in thickness.

9 Claims, 3 Drawing Sheets

(56) References Cited

U.S. PATENT DOCUMENTS

| | | |
|---|---|---|
| 6,774,450 B2 | 8/2004 | Inbe |
| 6,783,589 B2 * | 8/2004 | Dahl et al. .................. 117/84 |
| 6,800,933 B1 | 10/2004 | Mathews |
| 6,815,067 B2 | 11/2004 | Ata |
| 6,826,916 B2 | 12/2004 | Shimada |
| 6,965,513 B2 | 11/2005 | Montgomery et al. |
| 7,147,894 B2 * | 12/2006 | Zhou et al. .................. 427/256 |
| 8,039,726 B2 | 10/2011 | Zhang et al. |
| 2002/0031150 A1 | 3/2002 | Aikiyo |
| 2002/0182506 A1 | 12/2002 | Cagle |
| 2003/0099883 A1 | 5/2003 | Ochoa et al. |
| 2003/0193087 A1 | 10/2003 | Hayashi |
| 2003/0198021 A1 | 10/2003 | Freedman |
| 2003/0207573 A1 | 11/2003 | Ramm |
| 2004/0046223 A1 | 3/2004 | Muller |
| 2004/0057893 A1 | 3/2004 | Okubo |
| 2004/0132269 A1 | 7/2004 | Zhang |
| 2004/0258109 A1 | 12/2004 | Tojo |
| 2004/0262744 A1 * | 12/2004 | Dahl et al. .................. 257/712 |
| 2005/0045702 A1 | 3/2005 | Freeman et al. |
| 2005/0053542 A1 | 3/2005 | Harutyunyan |
| 2005/0061232 A1 | 3/2005 | Werner |
| 2005/0146060 A1 | 7/2005 | Suzuki |
| 2005/0150539 A1 | 7/2005 | Ghoshal |
| 2006/0001140 A1 | 1/2006 | Lee |
| 2006/0001153 A1 | 1/2006 | Sakamoto |
| 2006/0005944 A1 | 1/2006 | Wang |
| 2006/0266402 A1 | 11/2006 | Zhang et al. |

OTHER PUBLICATIONS

Rudometov et al., Peltier Coolers, http://www.digit-life.com/articles/peltiercoolers/ , Jul. 2001.

Pipe et al., Bias-dependent Petier coefficient and internal cooling in bipolar devices, Physical Review, 66 125316 (2002).

Biljakovic et al., Thermal trasport in hard coabon prepared from $C_{60}$ fullerene, Journal of Physics: Condensed Matter, Oct. 1995.

* cited by examiner

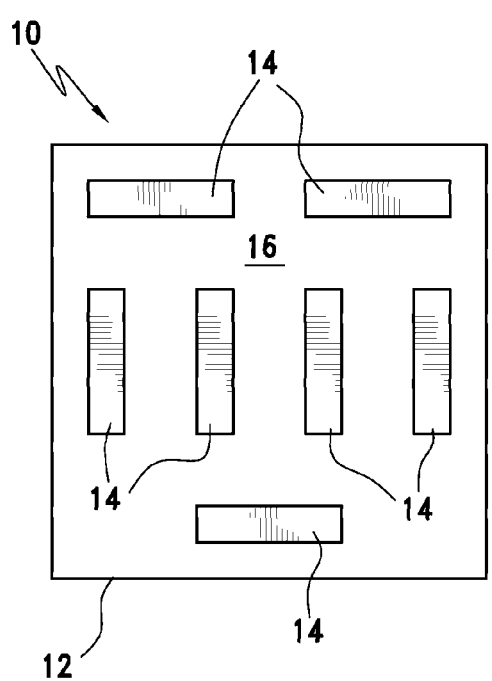
FIG. 1
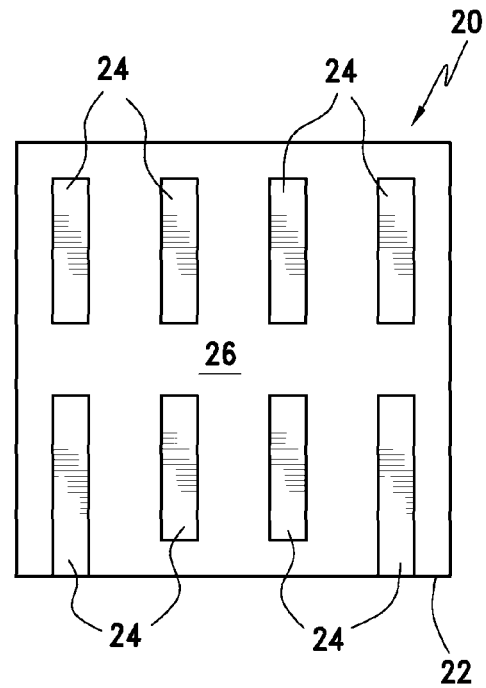
FIG. 2
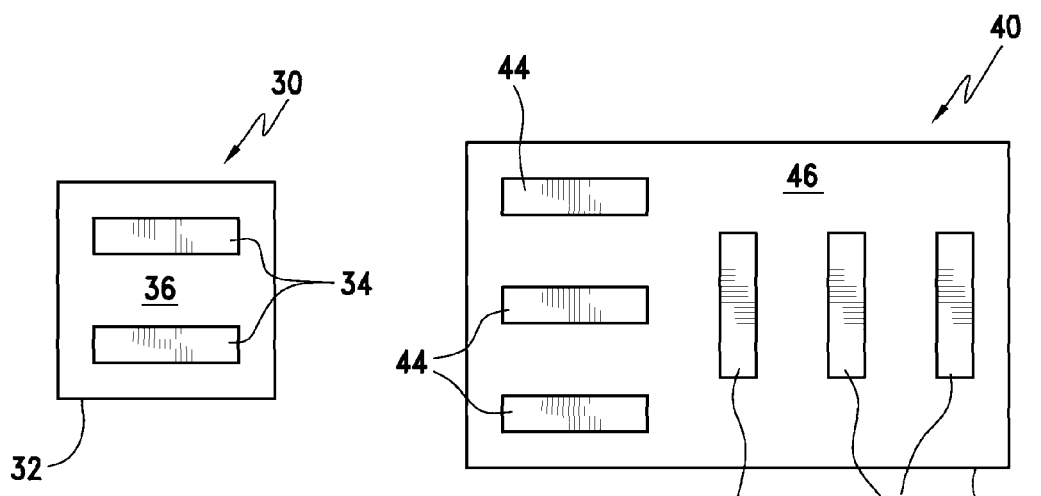
FIG. 3
FIG. 4

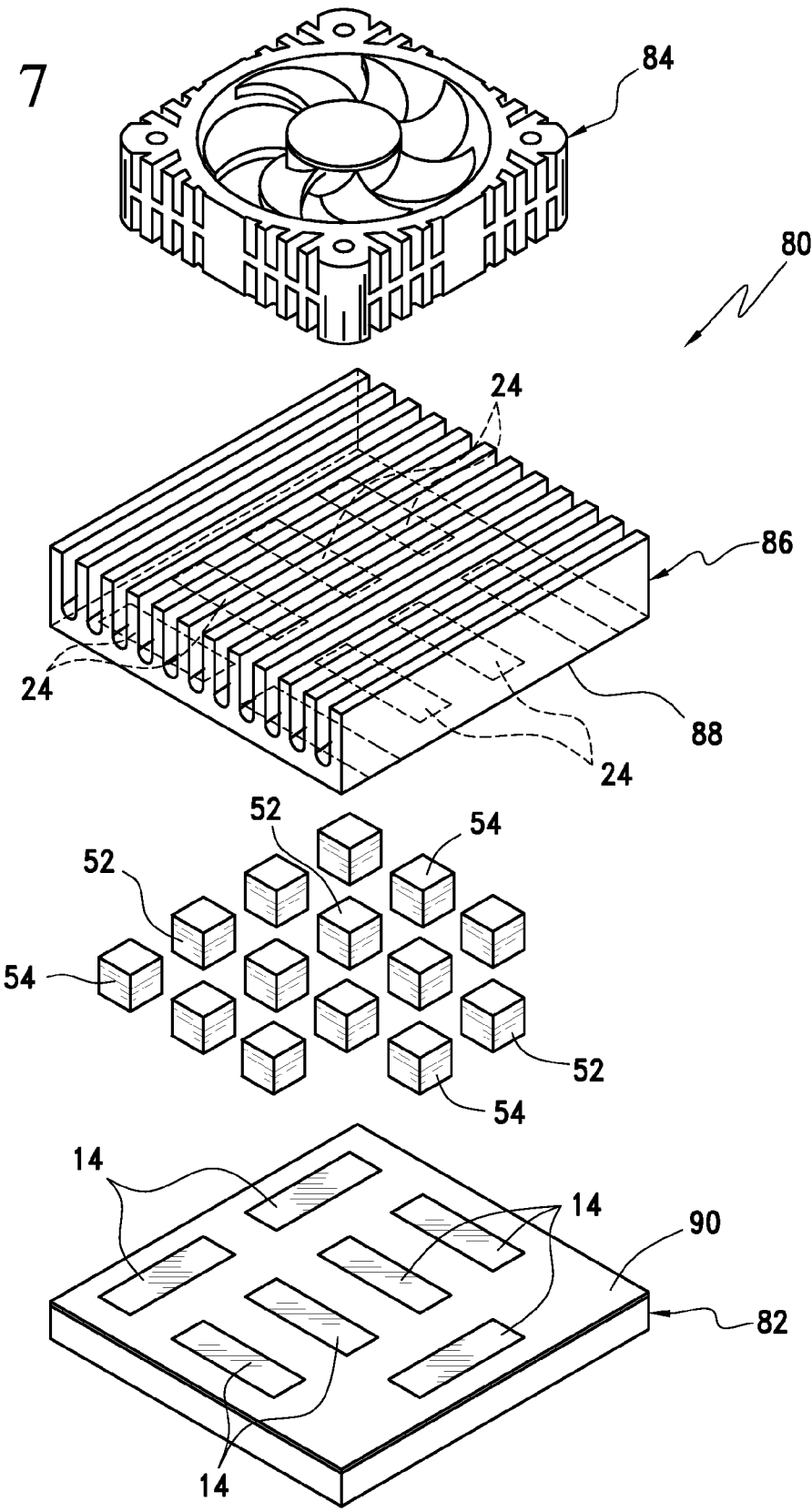

MICROPROCESSOR ASSEMBLY

This application is a continuation-in-part of U.S. application Ser. No. 10/127,585, filed Apr. 23, 2002, now U.S. Pat. No. 7,208,191.

BACKGROUND OF THE INVENTION

The invention relates to a carbon patterned structure, method of making and use. More particularly, the invention relates to a thermoelectric structure.

The dissipation of heat from physical objects, electrical circuits and especially from such devices as semiconductor chips, integrated circuits, microprocessors and charge coupled devices is important. Operating temperature has a direct impact on maximum available clocking speed and thus overall speed and performance of a semiconductor. Further, higher operating temperatures restrict the permissible operating voltage and ambient temperature environment of a circuit. Lastly, semiconductor life span is adversely impacted by higher operating temperatures.

Numerous types of cooling systems have been devised for controlling the temperature of electronic devices. In one mechanism, generated heat is transferred away from the component to ambient environment, usually the surrounding room air. The heat transfer can be accomplished for example, by associating a thermal dissipating device such as a heat sink, with the component. A heat sink is a thermal dissipating device that comprises a structure, generally metal, that is thermally coupled to a heat source such as a microprocessor. The heat sink draws heat energy away from the heat source by conduction of the energy from a high-temperature region to the lower-temperature region of the heat sink.

Heat sinks with or without forced convection have been used in integrated circuit design to provide macro scale convection cooling. Freedman, U.S. Pat. No. 7,208,191 teaches structures comprising a thermal energy generating component and a thermal dissipating device in thermal conductive contact with the component. The thermal energy generating component may be an integrated circuit package such as a microprocessor. The thermal dissipating device comprises a substrate with a fullerene deposit. The thermal dissipating device effectively acts as a heat sink to dissipate heat away from the component.

However, conduction heat flow to the thermal dissipating device can be limited by heat flow pathway thermal resistance within the integrated circuit package to the heat sink or to dissipation to the ambient. Regardless of the effectiveness of the heat sink or dissipating device associated with the package, an effective conductive heat transfer pathway through package to the heat sink must be provided to avoid localized areas of high temperature or "hot spots."

Currently, there is a need for an improved heat dissipating system associated with integrated circuit packages that dissipates greater amounts of heat per unit size and for a method of producing such a structure within cost constraints. There is a need for an effective conductive heat transfer pathway through the integrated circuit package for dissipation to the ambient either directly or via an associated heat sink

BRIEF DESCRIPTION OF THE INVENTION

The invention provides a patterned discontinuous thin film structure that provides an effective conductive heat transfer pathway through an integrated circuit package for dissipation to the ambient either directly or via an associated heat sink. The structure comprises a substrate and a patterned fullerene thin film surface.

An embodiment of the invention is a method of making a structure, comprising applying a patterned fullerene thin film heat conductor to a substrate surface.

Another embodiment of the invention is a thermoelectric element comprising an at least one thermoelectric material layer disposed between an n-type semiconductor and a p-type semiconductor wherein the at least one thermoelectric material layer comprises a fullerene thin film deposited on a surface of a substrate.

Another embodiment of the invention is an electronic module, comprising: a thermal energy generating component; and a thermoelectric element in heat transfer communication with the thermal energy generating component and comprising at least one substrate with a patterned discontinuous fullerene thin film.

Another embodiment of the invention is a heat dissipating system, comprising a thermal dissipating device in thermal conductive contact with a thermoelectric element comprising a substrate with a fullerene thin film.

Another embodiment of the invention is a method for making a thermoelectric element, comprising: providing a substrate; applying a mask to the substrate, the mask having openings that define a pattern and removing the mask to product a patterned fullerene thin film surface on the substrate.

Another embodiment of the invention is a method for making a thermoelectric element, comprising: providing a substrate; applying a fullerene thin film to the substrate; applying a mask to the substrate and thin film, the mask having openings that define a pattern of fullerene thin film; removing material exposed by the mask openings to produce a substrate with a patterned fullerene thin film surface.

Another embodiment is a method for making a thermoelectric element, comprising; providing a substrate; applying a mask to the substrate, the mask having openings that define a pattern; applying a fullerene thin film to the masked substrate; and removing the mask to produce a substrate with a patterned fullerene thin film surface.

Still another embodiment of the invention is a method of producing a computer, comprising applying a fullerene thin film onto a substrate and disposing the substrate in a heat dissipation relationship to a microprocessor.

BRIEF DESCRIPTION OF THE DRAWINGS

FIGS. 1 to 4 are top views of structure, each with a different applied surface discontinuous fullerene thin film;

FIG. 7 is an exploded perspective view of a microprocessor assembly.

DETAILED DESCRIPTION OF THE INVENTION

Figure 5:
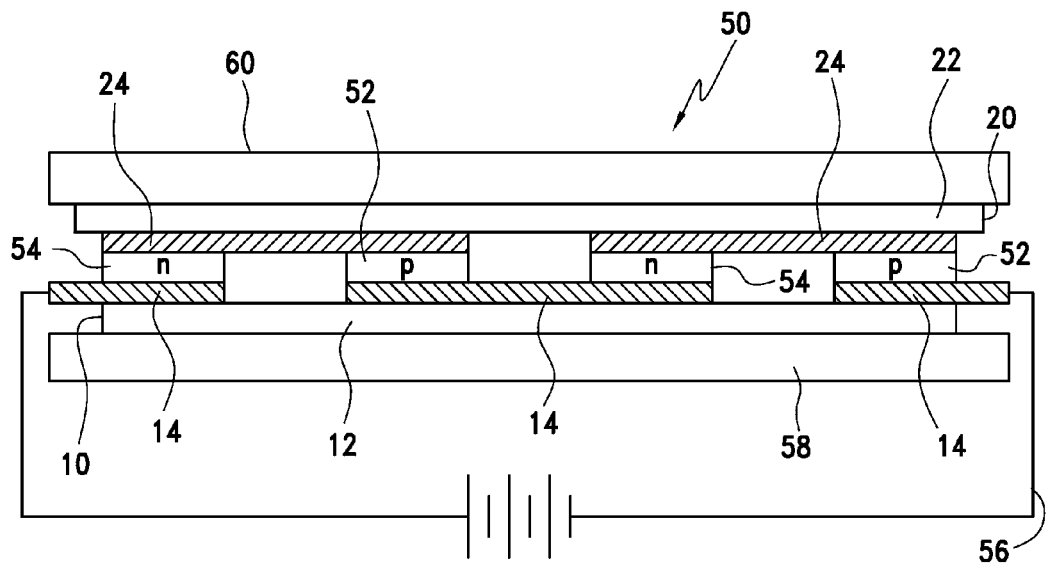
FIG. 5 is a schematic front elevation view of a thermoelectric element.

In this application, "patterned" means a plurality of discontinuous forms on a flat substrate surface or an arrangement of defined, systematic shapes on a regular flat surface. In an embodiment, the invention relates to a thermoelectric element formed from at least one substrate with a patterned fullerene thin film thermoelectric element. In this embodiment, the patterned fullerene surface of one substrate comprises a plurality of discontinuous fullerene thin films that form a system that interacts and that is interdependent with a second and corresponding patterned fullerene thin film surface on a flat substrate surface.

Unlike other cooling systems, a thermoelectric element has no moving parts. The lack of moving parts increases reliability and reduces maintenance. The element can be manufactured in small sizes making it attractive for small-scale applications. A thermoelectric element can be operated in vacuum and/or weightless environments and can be oriented in different directions without affecting performance.

A thermoelectric element includes a p-type semiconductor and an n-type semiconductor. The p-type and n-type semiconductors are formed between opposing electric insulators and opposing electron conductors. The electrical insulators have good thermal conducting properties but poor electrical conducting properties. The n-type semiconductor has excessive electrons while the p-type semiconductor has insufficient electrons. When voltage is applied across the conductors, heat is absorbed at one electrode producing a cooling effect while heat is generated at the other electrode producing a heating effect. Heat energy is transferred via the electrons flowing through the n-type semiconductor and the electrical conductors. Electrons then change to a low energy state as heat energy is released at the connecting electrical conductor.

In an embodiment of the invention, a thermoelectric element comprises a substrate with a patterned fullerene thin film. The patterned structure of the invention can provide an unconnected electron pathway that corresponds to an end to end electron conductor (1) between an n-type semiconductor material and a p-type semiconductor material or (2) between a p-type semiconductor to an n-type semiconductor material. The fullerene thin film patterned structure can be combined with the p-type semiconductor, the n-type semiconductor and another complementary pathway forming configuration to form a thermoelectric cooling element. The thermoelectric cooling element can be used to provide solid-state cooling of small electronic devices. Since according to Freedman, U.S. Pat. No. 7,208,191, a fullerene thin film can be formed as thin as a single molecule, it can provide a tight interface contact with the semiconductors between layers of a substrate material. The disclosure of the Freedman Publication is incorporated into this specification by reference in its entirety.

In this application, "fullerene" is a class of carbon molecules having an even number of carbon atoms that can be arranged in the form of a closed hollow cage, typically spheroid, wherein carbon-carbon bonds define a polyhedral structure reminiscent of a soccer ball. The most well studied fullerene is $C_{60}$, buckminsterfullerene. Other known fullerenes include $C_{70}$, $C_{75}$, $C_{78}$, $C_{82}$, $C_{84}$, $C_{90}$ and $C_{96}$. Also, the term includes nanotubes, which are cylindrical fullerenes. Fullerene nanotubes are usually only a few nanometers wide, but they can range from less than a micrometer to a full meter in length. Their molecular structure results in unique macroscopic properties, including high tensile strength, high hole transport and chemical inactivity. Also, in this application the term includes an "endohedral" fullerene, for example a metallofullerene, which is usually a $C_{82}$ or $C_{84}$ cage with an entrapped metal. For example, lanthanum, yttrium, scandium or a nobel gas can be fullerene cage entrapped as for example La@$C_{82}$ and $Sc_2$@$C_{84}$. A fullerene can be prepared by condensing vaporized carbon in an inert atmosphere. For example, an arc-discharge method can be used to evaporate carbon atoms by electric discharge of graphite rod electrodes. Or, laser vaporization or plasma vapor methods can be used.

These and other features will become apparent from the drawings and following detailed discussion, which by way of example without imitation describe preferred embodiments of the invention. In the drawings, corresponding reference characters indicate corresponding parts throughout the several figures.

FIG. 1 is a top view of a structure 10 that includes a substrate 12 with a discontinuous or patterned fullerene thin film 14 applied to the substrate surface 16. The substrate 12 comprises an electrically insulating and thermally conductive material including any suitable flat surface. The substrate 12 can be a ceramic or polymer shelf. In an aspect, the invention includes a relatively low melting point material, as hereinafter described. Suitable substrate 12 materials include polycarbonates and polymethacrylates. Even polyethylene and polypropylene films may be selected as suitable. These materials import substantial lightweight and/or flexibility properties.

The patterned fullerene thin film 12 is formed by any suitable method, including a masked vapor deposition process. A suitable vapor-deposition device comprises a reaction chamber capable of maintaining vacuum or lower pressure and a heater such as a resistance heater for vaporizing the fullerene molecules. In one process, the fullerene is sublimed from a powder by heating to a temperature greater than about 450° C. under low pressures, preferably less than about $1 \times 10^{-6}$ torr. Preferred sublimation temperatures are included in a range from about 450° C. to about 550° C. In one process, the fullerene powder is heated to a first lower temperature, preferably from about 200° C. to about 350° C. to remove any solvent or other impurities. In this process, the sublimation step can be conducted at less of a reduced pressure but at a higher temperature. However, it is preferred that the sublimation step is conducted at lower pressure, preferably less than about $1 \times 10^{-8}$ torr.

The heater fullerene molecules form a vapor-deposited film 14 on the substrate surface 16. In these methods, the film can be selectively applied to the substrate surface 16 using a mask or lattice structure. Or the film can be deposited, a mask or lattice structure applied and the film selectively etched or otherwise removed to provide a fullerene thin film 14 pattern of the invention. The mask can be a sacrificial material such as a polycrystalline-silicon. In the depositing step, the fullerene powder can be placed in a porous container or tube and the substrate 12 placed at the tube or container opposite end. The substrate surface 16 is protected while the powder is brought to sublimation temperature and pressure. When the sublimation pressure and temperature are reached, the substrate surface 16 is exposed while maintained at a lower temperature. The fullerene vapor condenses onto the substrate surface 16 and forms to the substrate surface material.

In an embodiment, the substrate 12 is swept past the fullerene powder source at a rate to provide desired condensation and deposit. Exposure time and sublimation conditions can be monitored by an appropriate device such as real-space STM atomic imaging device to control deposition to a desired fullerene deposit thickness on the substrate surface 16. One such method comprises positioning a tunneling tip device at a desired detecting position with respect to the substrate 12 and controlling application of the fullerene thin film to the substrate surface 16 according to the positioned tunneling tip device. In this embodiment, control can be according to detection of a current between the tip of the device and the fullerene thin film 14 depositing on the substrate surface 16.

In another embodiment, the fullerene thin film 24 is deposited by sublimation from a solution. For example, the carbon thin film can be applied by a langmuir-Blodgett (LB) technique or by solution evaporation using a solution of fullerene dissolved in a non-polar organic solvent such as benzene or toluene. The resulting solution is loaded into a resistively heated stainless steel tube oven. The oven is placed into a vacuum chamber, which is evacuated to approximately $10^{-6}$ Torr. The oven is then heated to about 150° C. for five minutes. A substrate is rotated above the tube oven opening. The tube is then further heated to at least 450° C., preferably to approximately 550° C. to sublime the fullerene from the solvent onto the substrate surface 16.

After formation, the fullerene thin film 14 can be polymerized by methods including photopolymerization, electron beam polymerization, X-ray polymerization, electromagnetic polymerization, plasma polymerization, micro-wave polymerization method and electronic polymerization. In electron beam polymerization, an electron beam is irradiated from an electron gun. The fullerene molecules are excited by the electron beam and polymerized at an excited state. In X-ray polymerization, X-rays are irradiated from an X-ray tube in place of an electron beam. The fullerene molecules are excited by the X-rays and polymerized at the excited state. These methods produce a fullerene polymer thin film 14 consisting essentially of fullerene molecules bonded together by covalent bonds.

Suitable plasma polymerization methods include a high-frequency plasma method, a DC plasma method and an ECR plasma method. A typical high-frequency plasma polymerization apparatus can include a vacuum vessel with opposing electrodes. The electrodes are connected to an outer high frequency power source. A molybdenum boat accommodates fullerene starling material within the vessel. The vessel is connected to an external resistance heating power source. In operation, a low-pressure inert gas, such as argon, is introduced into the vacuum vessel. After the vacuum vessel is charged with inert gas, current is supplied to vaporize the fullerene to generate a plasma. The fullerene plasma is illuminated by illuminating electromagnetic waves such as RF plasma, to polymerize the fullerene molecules to deposit as a fullerene polymer film. The amount of deposited thin film can be controlled by control of the temperature of the substrate surface 16. Increasing the temperature, decreases the amount of deposited film. Typically, the substrate surface 16 is maintained at a temperature of 300° C. or less. If plasma power is of the order of 100 W, the temperature need not exceed 70° C. Thickness of the deposited film can be measured to control the film thickness.

As pointed out above, in one method the thin film 14 patterned structure of the invention can be fabricated by masking the substrate surface 16 during a deposition procedure or by masking an applied thin film during a subsequent etching step. In the first instance, the mask can define deposition areas to create the patterned areas of the structure of the invention. Typically, the mask is a metal or a ceramic material. However, the mask can be formed of any suitable material. The mask can be made of a material that can be relatively easily removed, such as by physical removal, dissolving in water or in a solvent, by chemically or electrochemically etching, or by vaporizing through heating. The deposition mask can be a metal oxide, such as silicon oxide or aluminum oxide or water-soluble or solvent-soluble salts such as sodium chloride, silver chloride, potassium nitrate, copper sulfate, and indium chloride, or soluble organic materials such as sugar and glucose. The mask material can also be a chemically etchable metal or alloy such as Cu, Ni, Fe, Co, Mo, V, Al, Zn, In, Ag, Cu—Ni alloy, Ni—Fe alloy and others, or base-dissolvable metals such a Al can also be used. The mask can be made of a soluble polymer such as polyvinyl alcohol, polyvinyl acetate, polyacrylamide or acrylonitrile-butadiene-styrene. The removable mask, alternatively, can be a volatile (evaporable) material such as PMMA polymer. These materials can be dissolved in an acid such as hydrochloric acid, aqua regia, or nitric acid, or can be dissolved away in a base solution such as sodium hydroxide or ammonia. The removable layer or mask may also be a vaporizable material such as Zn which can be decomposed or burned away by heat. The mask can be added by physically placing it on the substrate surface 16 (or on the deposited thin film 14), by chemical deposition such as electroplating or electroless plating, by physical vapor deposition such as sputtering, evaporation, laser ablation, ion beam deposition, or by chemical vapor decomposition.

In another aspect, the mask can be a metal oxide, such as quartz or sapphire. The metal oxide can be stenciled or patterned into the structures desired, such as holes, circles, and trenches. In another aspect, the deposition targets can be formed by placing an impurity, local defect, or stress on the substrate or the mask. The impurity, local defect, or stress can be placed by x-ray lithography, deep UV lithography, scanning probe lithography, electron beam lithography, ion beam lithography, optical lithography, electrochemical deposition, chemical deposition, electro-oxidation, electroplating, sputtering, thermal diffusion and evaporation, physical vapor deposition, sol-gel deposition, or chemical vapor deposition. In yet another aspect, the location and number of carbon thin films can be controlled by etching at desired location and not etching at all or etching at different rates the areas surrounding the desired area.

Additionally, methods of fabrication of the fullerene thin film include lithographic techniques such as optical and scanning probe lithography that fabricate a discontinuance or a structure at a specific location on the substrate. Existing optical and scanning probe lithographic technologies can be used to fabricate holes with controllable diameter at precise locations on the substrate with controllable depth. These methods include x-ray lithography, deep UV lithography, scanning probe lithography, electron beam lithography, ion beam lithography, and optical lithography. Scanning Probe Lithography can be used to fabricate structures, including the holes, with precise control over the of the location and dimension of the hole. Optical lithography is a technology capable of mass production of structures. Control of the location and dimension of structures, such as the holes, can be performed with precise control.

The thin film fullerene patterned substrate structure 10 can be fabricated by first depositing a fullerene thin film according to an above described deposition process or by any other suitable process followed by polymerization of the deposited thin film fullerene. And, the fullerene patterned substrate can be formed and simultaneously polymerized in the same disposition vessel by an exemplary microwave polymerization, electrolytic polymerization or the like.

Various polymerization device and processes are described in Ata et al., U.S. Pat. No. 6,815,067 and Ramm et al. U.S. application Ser. No. 10/439,359 (Publication 20030198021), each of which is incorporated herein by reference in their respective entireties. According to these references, a typical microwave polymerization apparatus includes a molybdenum boat that accommodates fullerene molecules as a starting material. Microwaves generate a depositing fullerene polymer by excitation of vaporized fullerene molecules. An electrolytic polymerization apparatus comprises an electrolytic cell that includes a positive electrode and a negative electrode connected to a potentiostat. A reference electrode is connected to the same potentiostat so that a pre-set electric potential can be applied across the positive/negative electrodes. Fullerene molecules and a supporting electrolyte are charged into the cell. The potentiostat applies a pre-set electrical energy the positive/negative electrodes to form fullerene anionic radicals, which precipitate as a thin fullerene film on the negative electrode and fullerene polymer precipitates and is recovered by filtration or drying and kneading into a rescind to form a thin fullerene polymer film.

In some applications of the invention, a thin monolayer fullerene film or fullerene polymer film may be desirable to provide the smallest and lightest possible structure that is an effective conductive structure without changing the electrical insulator substrate properties. In these applications, a thin, even monomolecular layer can be applied according to one or more procedures. One procedure takes advantage of strong fullerene to substrate bond. The fullerene bond to a metal/semiconductor substrate surface is stronger than inter molecular bonding among fullerene molecules.

Desorption temperature is related to bond strength among fullerene molecules or between fullerenes and substrate. Hence, strength of fullerene bonding can be estimated by the temperature at which a fullerene desorbs. For multilayer fullerene molecules on a substrate surface 16, fullerene desorption temperature is between 225° C. and 300° C. Hence, an applied temperature of higher than 225° C., desirably at least 350° C. and in some applications up to about 450° C. will effect fullerene desorption without disrupting the fullerene to substrate surface 16 bond. In one process, desorption of excess fullerenes beyond a monolayer can be achieved by heating at a temperature from about 225° C. to about 300° C. In one procedure, a fullerene monolayer film is formed by depositing a thin film of fullerene molecules onto the substrate surface 16 according to any of the above described deposition procedures. Layers of the deposited thin film 14 are removed to produce a residual film of desired thickness. The layers are removed by selectively breaking fullerene-to-fullerene intermolecular bonds without breaking the fullerene-to-substrate association or bonding and without subjecting the film or substrate to injurious temperatures, by this mechanism, excess fullerene can be removed beyond a desired thickness such as a monolayer, for example by heating to a temperature sufficient to break the fullerene-fullerene bonds without disrupting the fullerene monolayer 14 that is applied to the substrate surface 16.

Other methods of selectively breaking the fullerene intermolecular bond include laser beam, ion beam or electron beam selective radiation. For example, an energetic photon laser beam, electron beam or inert ion beam can be irradiated onto the deposited substrate with a controlled energy that is sufficient to break fullerene-to-fullerene intermolecular bonds without breaking fullerene-to-substrate associations or bonds. The parameters of the beam irradiation depend upon the energy, flux and duration of the beam and also depend on the angle of the beam to the fullerene thin film 14 deposit. In general, the energy of irradiation is controlled to avoid fullerene duration of the beam and also depend on the angle of the beam to the fullerene thin film 14 deposit. In general, the energy of irradiation is controlled to avoid fullerene molecule decomposition or reaction and to avoid excessive local heating. For example, it is preferred to operate a laser at an energy outside of the ultraviolet range preferably in the visible or infrared range, to avoid reacting fullerene molecules. On the other hand, the laser can be effectively operated in the ultraviolet range to cleave fullerene layers so long as operating conditions such as temperature, pressure and pulsation are controlled. In a preferred embodiment, the laser or other light source is operated in the visible or infrared portion of the spectrum. Light intensity and beam size can be adjusted to produce the desired desorption rate of fullerenes beyond a desired layer thickness such as a monolayer thickness.

If a sublimation step is used to form the initial fullerene thin film, the fullerene layers can be cleaved to a desired thickness in the same vacuum chamber where the substrate surface is cleaned and the fullerene thin film is deposited. Maintaining the substrate under vacuum keeps it clean and reduces beam scattering during irradiation. Additionally the vacuum can prevent fullerene recondensation by removing desorbed fullerene from the irradiation area.

An ion beam is generated by bombarding a molecular flow with high energy electrons that produce an ionization. The ion beam can be directed with electrodes. If an ion beam is used, beam energy and flux should be low enough to avoid decomposing the fullerene or forming higher-ordered fullerene molecules. For example, acceleration voltage can be as high as 3.0 kilovolts for some applications. Desirably, the voltage is between 50 and 1000, and preferably between about 100 and 300 volts. The beam current density can be in the range of about 0.05 to 5.0 $mA/m^2$ (milliAmperes per square centimeter).

If a gas cluster ion beam is employed, ion clusters are used that have an atomic mass approximating that of the fullerene molecules. A $C_{60}$ fullerene molecule has an atomic mass unit (AMU) of 720. Beams of clustered ions approximating the mass of the fullerene molecules can be used to inject energy into the multilayer fullerene thin film to break the fullerene-to-fullerene intermolecular bond without depreciating the fullerene molecules. Clusters can be formed by expanding an inert gas such as argon, through a supersonic nozzle followed by applying an electron beam or electric arc to form clusters.

The angle of incidence of a directed beam to the fullerene thin film can be varied to control dissociation. In one embodiment, a beam angle relative to irradiated target can be selected between about 25° and about 75°, preferably between 40° and 65°. When ion beam irradiation is used, incident angle is determined by balancing factors such as removal efficiency and precision.

In one aspect of the invention, it has been found that fullerene thin films can be applied to certain substrates that would otherwise be damaged by the conditions of thin film application. For example, fullerenes cannot be applied to certain lower melting substrates that would otherwise be damaged because of the high temperature requirements for fullerene sublimation. According to this embodiment of the invention, a method of applying a fullerene thin film to a substrate that melts at a temperature lower than the application temperature of the fullerene thin film (lower melting substrate) comprises first applying a fullerene thin film to a first higher melting temperature substrate (melting at a temperature higher than the application temperature of the thin film) to produce a first fullerene thin filmed substrate. The first fullerene thin film substrate is placed in contact with a lower melting temperature substrate with a first surface in contact with an exposed fullerene surface of the fullerene thin film substrate to form a two substrate structure with intermediate fullerene thin film between the substrates. A second fullerene deposit is then applied to an exposed surface of the second substrate and the intermediate fullerene deposit between the two substrates is cleaved to produce two fullerene deposit substrates, one of which is the lower melting temperature substrate. The intermediate fullerene deposit functions to dissipate heat away from the lower melting structure while the second deposit is applied at a temperature that otherwise could damage the lower melting substrate.

In an embodiment, the patterned structure 10 is a substrate 12 comprising deposited fullerene thin film 14 with or without a property enhancing dopant. The fullerene pattern of the of the invention can act as a hole transport thin film. The performance characteristics of the hole transit thin film can be determined by the ability of the fullerene to transport the charge carrier. Ohmic loss in the fullerene thin film is related to conductivity, which has a direct effect on operating voltage and also can determines the thermal load transported by the thin film. By doping at least one of the fullerene hole transport thin film patterns 14 with suitable acceptor material (p-doping), the charge carrier density and hence the conductivity is increased.

For example, the thin film fullerene 14 can be doped with a donor type (n-type) or acceptor type (p-type) dopant for some applications such as for a thermoelectric element. The dopant can be added to improve electric conductivity and heat stability. In an embodiment, the dopant is a polyanion. An alkali metal such as lithium, sodium, rubidium or cesium is another preferred dopant. Other examples of preferred dopants include alkali-earth metals such as calcium, magnesium and the like; quaternary amine compounds such as tetramethylammonium, tetramethylammonium, tetrapropylammonium, tetrabutylammonium, methyltriethylammonium and dimethyldiethylammonium. Preferably, the fullerene is doped to have an increased charge carrier density and effective charge carrier mobility for use as an element of a thermoelectric element.

In one aspect, a hydrogenated form of an organic compound is mixed as a dopant directly into the fullerene. The hydrogenated form of the organic compound is a neutral, nonionic molecule that can undergo complete sublimation. In the process, hydrogen, carbon monoxide, nitrogen or hydroxy radicals are split off and at least one electron is transferred to the fullerene or from the fullerene. Also, the method can use a salt of the organic dopant. Suitable organic dopants include cyclopentadiene, cycloheptatriene, a six-member heterocyclic condensed ring, a carbinol base or xanthene, acridine, diphenylamine, triphenylamine, azine, oxazine, thiazine or thioxanthene derivative. After mixing of the dopant, the mixture can be stimulated with radiation to transfer a charge from the organic dopant to the fullerene.

Referring again to the drawing figures, similarly to FIG. 1, FIGS. 2, 3 and 4 show structures 20, 30 and 40 that represent other embodiments of the patterned substrate 22, 32 and 42 of the invention. In each figure, the structure 20, 30 and 40 includes substrate 22, 32 and 42 with a fullerene thin film 24, 34 and 44 applied in a pattern to respective substrate surface 26, 36 and 46.

FIG. 5 is a front elevation view of a thermoelectric element, sometimes called a Peltier element. FIG. 5 shows a thermoelectric element 50, wherein like parts of the FIGS. 1 and 2 structures 10 and 20 are identified by the same part numbers. The FIG. 5 thermoelectric element 50 includes structures 10 and 20 with electric insulator substrates 12 and 22 with respective fullerene thin films 14 and 24 patterned to respective substrate surfaces 16 and 26.

The structures 10 and 20 of FIG. 1 and FIG. 2 bear a noteworthy relationship to one another as further illustrated in FIG. 5. The FIG. 2 view is an underside view of the FIG. 5 structure 20. The substrate 22 in FIG. 2 is the FIG. 5 electrical insulator 22 oriented 180° to disclose its underside to show the configuration of fullerene thin film 24 on the substrate surface 26. The patterned fullerene surface of substrate 12 comprises a plurality of discontinuous fullerene thin film applications 14 that form a system that interacts and that is interdependent with the second and corresponding patterned fullerene thin film 24 on flat substrate surface 26. The FIGS. 1, 2 and 5 taken together illustrate the complementary alignment of fullerene thin film patterns 14 and 24. In FIG. 5, structures 10 and 20 are folded over together with respective thin film patterned surfaces 16 and 26 facing one another, to form opposing plates 10 and 20 of a thermoelectric element 50 such as that shown in FIG. 5. The FIG. 5 element 50 comprises the FIG. 1 and FIG. 2 structures 10 and 20 together with pairs of p-type semiconductor posts 52 and n-type semiconductor posts 54 to comprise thermoelectric element 50.

In operation with reference to FIG. 5, the n-type semiconductors 54 will have excessive electrons while the p-type semiconductors 52 will have a deficiency of electrons. When DC power 56 is applied between the fullerene thin films 14, 24 electrons move from the fullerene thin films 14, 24 to the n-type semiconductor 54. The FIG. 5 heat source 58 schematically represents thermal energy generating component in need of cooling. The energy state of electrical conductor electrons rises due to heat energy absorbed from the heat source 58. Heat energy is transferred from the heat source 58 to a heat sink 60 as electrons flow through the n-type semiconductor 54 and the fullerene thin films 14 and 24. The electrons change to lower energy state as heat energy is transferred or released as at fullerene thin film 14.

Figure 6:
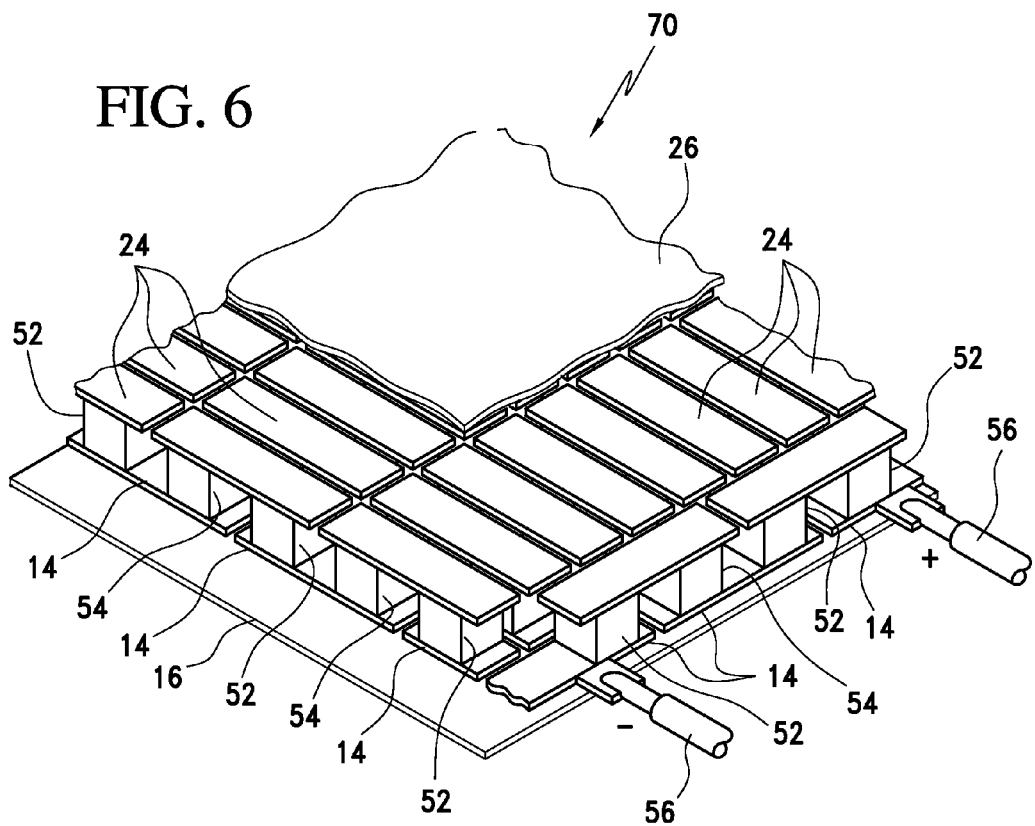
FIG. 6 is a perspective view of a thermoelectric element.

FIG. 6 shows a similar mechanism to the FIG. 5 thermoelectric element 50. FIG. 6 is a perspective view of a thermoelectric element 70. In FIG. 6, the thermoelectric element 70 transfers thermal energy from a first location to a second location. The thermoelectric elements 50 and 70 of FIGS. 5 and 6 are schematic representations of positive and negative thermoelements arranged on a substrate to provide an unconnected electron pathway that corresponds to an end to end electron conductor (1) between an type semiconductor material 54 and a p-type semiconductor material 52 or (2) between a p-type semiconductor 52 to an n-type semiconductor material 54. The FIG. 5 and FIG. 6 thermoelectric elements 50, 70 are solid-state structures that convert thermal energy from a temperature gradient into electrical energy (Siebeck effect) or convert electrical energy into a temperature gradient (Peltier effect). In FIGS. 5 and 6, thermoelectric elements 50 and 70 have opposing complementary patterned structures 10 and 20. The carbon patterned structures 10 and 20 provide a complementary pathway configuration to form a Peltier thermoelectric element for use in specialized cooling. In FIG. 5, the thermoelectric element 50 includes the p-type semiconductor 52 and an n-type semiconductor 54. The p-type and n-type semiconductors 52, 54 are positioned between opposing electrical insulators 12, 22 and opposing fullerene thin film conductors 14, 24.

In an embodiment, the invention relates to a fullerene patterned structure that is fabricated as described above and to a thermoelectric element that includes the fullerene patterned structure. The positive and negative charge carriers can relocate heat energy across an electronic module from one substrate surface to another surface. In some applications, the thermoelectric element can be interfaced with a heat dissipating device such as a heat sink. Otherwise, the relocated heat may not dissipate efficiently away from a protected electronic module and temperature will rise very quickly to overflow solder junctions and cause catastrophic failure.

The FIG. 7 microprocessor assembly 80 represents an exemplary electronic module of the invention. The assembly 80 comprises a printed circuit board 82, a fan 84 and a heat sink 86 The bottom 88, n-type semiconductors 54 and p-type semiconductors 52 and top surface 90 of the circuit board 82 can be considered an exploded view of a Peltier thermoelectric element 50 such as shown in FIG. 5 and as 70 in FIG. 6. The fan 84 can be screwed or otherwise secured on the top of the heat sink 86. The printed circuit board 82 is mounted in contact with the thermoelectric element comprising surface 88 with fullerene thin films 24, n-type semiconductors 54, p-type semiconductors 52 and surface 90 with fullerene thin film patterns 14. The assembly 80 can be part of a service device, which can be a computer, processor, controller or the like. In an embodiment, the heat sink 86 including fins, can be completely or partially coated with a fullerene thin film to dissipate heat that is moved by the thermoelectric element.

In general, large motors or high speed microprocessors require larger heat sinks 86 to dissipate increased heat generated by larger components. The improved heat dissipating capacity imparted by the invention thermoelectric element means that motor size or the size of any heat generating structure can be increased without requiring an enlarged associated heat dissipating device. The applied fullerene thin film pattern, which can be applied in a layer as thin as a single molecule, i.e., one nanometer, adds no significant bulk to the combined structure.

Fullerenes are commercially available from SES Research, Houston, Tex. Alternatively, there are well known ways of synthesizing fullerenes. For example, arc heating of graphite in an inert atmosphere, such as 150 torr He, results in carbon clusters from which fullerenes can be extracted with hot toluene. Fullerenes can be further purified by column chromatography of organic dispersions of fullerenes, such as with silica or alumina columns, to produce purified fullerenes.

Surprisingly, cost may be an advantage of a fullerene based thermoelectric component according to the invention. While a fullerene may be expensive on a gram basis, only a small amount of material is required to form an effective thin film according to the invention. For example, a square meter one molecule thick can be covered at the same expense as layer of diamond carbon 10 atoms thick. That's about a nanometer high, covering a square meter. The volume of that carbon is $1E^{-9}$ m$^3$ or $1E^{-3}$ cm$^3$.

While preferred embodiments of the invention have been described, the present invention is capable of variation and modification and therefore should not be limited to the precise details of the Examples. For example, FIG. 7 illustrates a thermoelectric module, a heat sink and a fan in combination. However, the invention encompasses any combination of the illustrated microprocessor assembly elements, for example at least: (1) a microprocessor assembly embodiment that includes a thermoelectric module according to the invention without a heat sink or fan; (2) a microprocessor assembly embodiment that includes a heat sink according to the invention without the thermoelectric module or fan; and (3) a microprocessor assembly embodiment that includes a thermoelectric module according to the invention, a heat sink according to the invention without the fan. The invention includes all changes and alternatives that fall within the purview of the following claims.

What is claimed is:

1. A microprocessor assembly, comprising:
    a heat generating microprocessor;
    a heat sink connected in a heat dissipating relationship to the microprocessor and comprising a first thermally conductive substrate having a first electrically conductive patterned discontinuous fullerene thin film disposed thereon, the fullerene thin film configured thermally transmissive to the microprocessor;
    a second thermally conductive substrate having a second patterned discontinuous fullerene thin film disposed thereon, configured in a thermally transmissive pattern arranged such that the first and second patterned thin films are in a complementary offset and opposing relationship to one another;
    at least one pair of semiconductors of opposing conductivity type connecting the first and second thermally conductive substrates and configured in an alternating n-type element to p-type element continuous electrically conductive circuit with said first and second thin films; and
    an electrical power source coupled to the continuous electrically conductive circuit.

2. The microprocessor assembly of claim 1, wherein at least one patterned discontinuous fullerene thin film comprises an arrangement of defined, systematic shapes on a regular continuous flat substrate surface.

3. The microprocessor assembly of claim 1, wherein at least one patterned discontinuous fullerene thin film comprises a fullerene selected from $C_{60}$, $C_{70}$, $C_{76}$, $C_{78}$, $C_{82}$, $C_{84}$, $C_{90}$ and $C_{96}$.

4. The microprocessor assembly of claim 1, wherein at least one patterned discontinuous fullerene thin film comprises a nanotube.

5. The microprocessor assembly of claim 1, wherein at least one patterned discontinuous fullerene thin film comprises a metallofullerene.

6. The microprocessor assembly of claim 1, wherein at least one patterned discontinuous fullerene thin film comprises a fullerene including a dopant.

7. The microprocessor assembly of claim 1, wherein at least one substrate comprises a material selected from a ceramic, a polycarbonate, a polymethacrylate, polyethylene and a polypropylene.

8. The microprocessor assembly of claim 1, wherein at east one fullerene thin film comprises a substantially one molecule thick film.

9. The microprocessor assembly of claim 1, wherein the first and second thermally conductive substrates are arranged such that the first and second patterned thin films are in a complementary offset and opposing relationship to one another, connected by the semiconductor pair in an alternating n-type element to p-type serpentine circuit configuration.

* * * * *